(12) United States Patent
Novak et al.

(10) Patent No.: US 6,278,203 B1
(45) Date of Patent: Aug. 21, 2001

(54) COOLING STRUCTURE FOR A LINEAR MOTOR

(75) Inventors: W. Thomas Novak, Hillsborough; Andrew J. Hazelton, San Carlos; Ken G. Wasson, Foster City, all of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/447,200

(22) Filed: Nov. 22, 1999

(51) Int. Cl.[7] ................................................. H02K 41/03
(52) U.S. Cl. ............................................. 310/12; 414/935
(58) Field of Search .......................... 310/12, 13, 14; 318/135

(56) References Cited

U.S. PATENT DOCUMENTS

| | | | |
|---|---|---|---|
| 4,625,132 | 11/1986 | Chitayat | 310/13 |
| 4,749,921 | 6/1988 | Chitayat | 318/135 |
| 4,772,828 | 9/1988 | Heymans et al. | 318/128 |
| 4,839,543 | * 6/1989 | Beakley et al. | 310/12 |
| 4,839,545 | 6/1989 | Chitayat | 310/12 |
| 4,906,878 | 3/1990 | Twaalfhoven et al. | 310/12 |
| 4,916,340 | 4/1990 | Negishi | 310/12 |
| 5,073,734 | 12/1991 | Combette | 310/65 |
| 5,473,410 | 12/1995 | Nishi | 355/53 |
| 6,084,319 | * 7/2000 | Kamata et al. | 310/12 |

FOREIGN PATENT DOCUMENTS

| | | |
|---|---|---|
| 5-45102 | 8/1989 | (JP) . |
| 8-168229 | 6/1996 | (JP) . |

* cited by examiner

*Primary Examiner*—Elvin Enad
*Assistant Examiner*—Judson H. Jones
(74) *Attorney, Agent, or Firm*—Skjerven Morrill MacPherson LLP; Norman R. Klivans

(57) ABSTRACT

Apparatus and associated method for cooling a linear motor coil includes a motor coil having side walls, and at least one enclosure member which encloses each linear side wall and extends generally co-extensively with a width and a length of the side walls and juxtaposed to the side walls. Coolant passages are formed between and around an exterior of the side walls and the interior walls of at least one enclosure member for enclosing a coolant fluid flowable against the side walls. An inlet plenum is in flow connection to the coolant passages for flowing the coolant fluid through the coolant passages to cool the side walls and an outlet plenum is in flow connection to the coolant passages for removal of coolant fluid heated by operation of the motor coil.

17 Claims, 10 Drawing Sheets

COOLING STRUCTURE FOR A LINEAR MOTOR

FIELD OF THE INVENTION

This disclosure is directed to the cooling of linear motors. More particularly the disclosure relates to a structure for cooling the coil assembly of a linear motor and preventing heating of the surrounding environment.

BACKGROUND

Excessive heating of the coils of a linear motor causes an increase in the resistance of the coils, exacerbating the heat problem and reducing the performance of the motor. In addition, this heat is carried away to the outside air and often to the rest of the machine in which the motor is utilized. Heat changes the index of refraction of air and consequently reduces the accuracy of laser interferometers and other optical systems. In addition, the heat causes thermal expansion of machine components, resulting in inaccuracy of precision mechanical systems.

Most commercially available linear motors are not actively cooled. Typically the coils are potted in a moderately conductive epoxy and the motor is cooled through convection into the surrounding air. Trilogy Systems provides an option to their motor where cooling fluid is circulated through a metal mounting bracket of the coil assembly. Because this bracket is mounted only to the top of the motor, not all of the heat is carried away from the motor and a significant portion of it is still convected into the surrounding environment.

U.S. Pat. No. 4,749,921 issued to Anwar Chitayat describes a linear motor. Included is a concept for cooling the linear motor coils. FIG. 8 in this patent shows a system of hollow tubes that are potted with the coil assembly. Coolant can flow through these tubes providing cooling. In U.S. Pat. No. 4,625,132 also issued to Anwar Chitayat, a controlled flow of cooling gas is directed between the motor stator and the moving element with flexible seals on each arm of a U-shaped channel mount a wound stator. In another Chitayat U.S. Pat. No. 4,839,545 an armature of a linear motor is cooled by coolant flowing through a lower serpentine channel in thermal contact with laminations of the motor armature.

U.S. Pat. No. 4,906,878 discloses a linear motor with cross-flow passageways or tubes connecting between inlet and outlet manifolds to remove heat from the motor coils. U.S. Pat. No. 4,916,340 utilizes heat insulating materials with a cooling medium (water) flowing through passageways on coil supporting members. U.S. Pat. No. 5,073,734 discloses a coolant for cooling between linear motor spacers and a screen support having cooling fins.

Yaskawa Japan Laid Open Application Heisei 8-168229 provides a linear motor that is enclosed in a stainless steel can (housing). This can has a small gap along the outside of the coils, which enables (not disclosed) coolant to be forced along the gap between the can and the coils to provide cooling of the motor. Yaskawa Utility Model Application Heisei 5-45102 includes a coil bobbin with a cooling path inside the bobbin.

Typical linear motors that are not cooled have inefficient motor operation due to increased coil resistance with temperature, heating of surrounding air, and heating of surrounding machine elements as discussed above. Motors that are only cooled through the mounting bracket do not provide direct cooling of the coils and suffer from the same disadvantages. The cooled motor of U.S. Pat. No. 4,749,921 and others of the above patents require cooling passages to be created within the coil assembly. This is difficult and can typically only be done by wrapping the coils with tubing and encapsulating the assembly in an epoxy. It also does not completely isolate the motor from the outside air because the cooling tubes do not completely enclose the coils. The Yaskawa disclosures include cooling arrangements which cannot be completely adapted to all motor configurations. In addition, both rely on an exterior thermal insulation or an exterior can (13 and 29, respectively) that may be difficult to fabricate. In both Yaskawa disclosures the cooling is on the inside of the bobbin or inside the can; coil heat may be transferred directly from the coil outer surfaces to the outside environment resulting in detriment to the machine in which the motor is being utilized.

SUMMARY

This disclosure is directed to novel cooling structures for linear motors. In accordance with some embodiments, no extra cooling tubes or components are needed within the coil assembly itself and cooling is accomplished by flowing coolant in a passage or a space between the surfaces of the coils and the coil enclosures. This prevents heat from the coils from reaching, for example, nearby interferometer or other optical systems, where the heat can change the index of refraction of air and reduce the accuracy of such systems or cause thermal expansion of machine components with resultant inaccuracies of the precision mechanical systems.

Typically in a lithographic (e.g. stepper) machine used in the processing of semiconductors wafers and the like, as many as eight linear motors are used to drive positioning elements (such as the reticle stage and wafer stage) of the stepper. This multiplicity of motors obviously compounds the problem of detrimental heat from the individual linear motors. In most applications, motors are cooled to prevent the motor from overheating and the coolant transfers the motor heat to the environment.

In the case of lithographic machines, the problem as recognized by the present inventors is not motor overheating but preventing the motor heat from reaching the environment and thereby adversely affecting the machine's interferometry systems. Hence here the motor heat is confined to the coil and coolant so that it is not transferred to the motor coil housing. Thus direct thermal contact between the motor coils and their housing is minimized.

One embodiment solves these problems in a band coil arrangement by providing integrally cast recesses forming cooling channels in a cast encapsulant block partially surrounding the coil assembly, along with closure members affixed over the cooling channels. An overall linear armature of a required substantial length with a minimal transverse thickness results. The structure allows coolant flow parallel to the length of the coil assembly along the height and length of the exterior surfaces of the coil assembly, the flow being between the coil assembly and the conforming coil enclosure, thus preventing heat from the coils escaping into the surrounding air.

While in one embodiment the coil assembly is partially encapsulated in e.g. a cast rigid epoxy which has a relatively low thermal conductance and a minimal thickness to provide a short heat path to the flowing coolant, preferably no such epoxy is present between most of the actual coil surfaces and the coolant. In order to prevent short-circuiting of the flowing coolant in the cast recesses, in one embodiment an integrally cast longitudinal spacer is provided extending over part of the length of the recesses in the cast encapsulant forming the coolant channels. The spacers terminate short of the ends of the recesses so that a cast divided annular channel is formed on each of opposite surfaces of the encapsulated coil assembly. Sealing of the channel is provided by a sheet metal or plastic closure member which with the ends of the assembly form an enclosure around the assembly of coils. The member may be adhered to or otherwise connected to the encapsulation block surrounding the respective recesses. The insulation block also contains a coolant inlet and plenum with coolant bores directing coolant to one end of the sealed recesses and a coolant outlet and plenum with coolant bores directing pumped coolant from the other end of the recesses to the coolant outlet.

In another embodiment called a centerpole cooling arrangement, physical insulating spacers are placed between each coil and extending between the outside enclosure (can or housing), and an inside enclosure, with a gap therebetween. Cooling fluid flows along the outside of the coils and through a gap between the coils and the inner enclosure and between the coils and inner surface of the outer enclosure.

The centerpole motor cooling arrangement includes a coil assembly with a thin e.g. metal enclosure on both the inside and the outside. The coils are separated slightly by insulating spacers along the axis of travel. The insulating spacers are slightly larger than the coils and create a small gap between the coil and the outside and inside enclosures. Cooling fluid can then be pumped or forced into an inlet plenum in the top of the enclosure and along the top of the coils. As the fluid flows along this channel the fluid runs along the coils and down the small channels along the sides of the coils. The fluid collects in an outlet plenum and flows out of the enclosure. This cooling approach is advantageous because the outside environment is affected only by the heat of the cooling fluid as transmitted through the enclosure. The much hotter coils are in all locations insulated from the outside by the cooling fluid. Thus, provided the flow rate of the cooling fluid can carry away the generated heat without excessive temperature rise, the heat transfer rate from the coils is unimportant, provided that the temperature of any coil does not rise to the point of causing damage.

A double layer coil cooling arrangement uses an array of coils that are stacked such that internal cooling passages exist between the coils. In this arrangement, pockets exist in the center of each coil. The coils are configured to allow for small passages between adjacent pockets and the conforming enclosure, thus coolant can flow from one pocket to the next along the length of the coil assembly. The coil assembly is sandwiched between thin e.g. metal or plastic sheets, creating an enclosure around the coils. Thus, coolant can be introduced at one end of the coil assembly into an inlet plenum, carry heat away from each of the coils along the length of the assembly, and exit at the other end of the assembly from an outlet plenum.

In a dogbone motor coil cooling arrangement an enclosure for the coil has the shape of a conforming "dogbone". A small gap is defined between the coils and the enclosure inside walls, along the sides, top, and bottom, using insulating spacers. Cooling fluid can then be introduced at the inlet plenum end of the coil assembly inside the enclosure, and will flow along the outside of the coils in the gap created by the spacers to an outlet plenum. This fluid will carry away the heat generated by the coils. As in other of the embodiments the coolant flows between the coils and the surrounding environment, thus preventing heat from the coils from escaping.

Hence in one embodiment a cooling structure and method for a coil of a linear motor include an enclosure member conforming to at least one side wall of the motor coil. Coolant passages are provided between the enclosure member and the motor coil sidewall. Inlet and outlet connections are provided to flow a fluid coolant through the coolant passages.

DETAILED DESCRIPTION

Figure 1A:
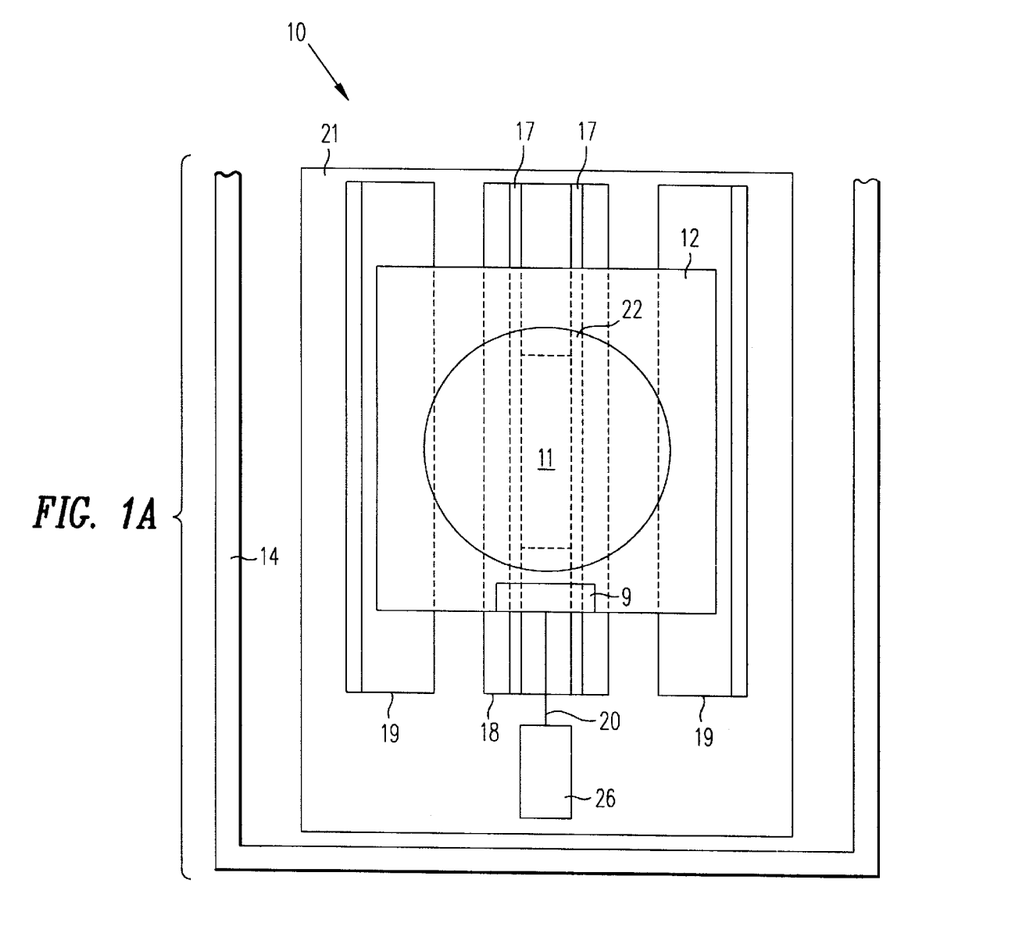
FIG. 1A is a schematic top view of a stage for a stepper (lithographic) machine with the linear motor driving the stage.

FIG. 1A schematically shows a top view of a stepper chamber 14 in a lithographic measuring and processing system 10 (e.g., a stepper machine). The lithographic system 10 includes a stage 12 (e.g., a wafer stage) and an apparatus floor support surface 21. A yoke 18 and two linear guideways 19 are mounted on the floor support surface 21. The stage 12 has a mirror system 9 and a wafer table 22 mounting a wafer on the upper surface thereon, and has a linear motor coil assembly 11 driving the stage 12 on the under surface. In order to measure the position of the stage 12, the interferometry measurement system 26 emits a laser beam 20 incident on the mirror system 9. As is known in the interferometry measurement art, the beam is split through a 45° beam splitter in system 26. One beam is reflected off a fixed reference mirror in system 26 and the other beam is reflected off mirror system 9 attached to the wafer stage.

These beams are then recombined and a sensor in system 26 detects changes in the position of the wafer stage mirror 9. While FIG. 1A illustrates a wafer stage, the present invention is also applicable to reticle stages and other applications of linear motors.

Figure 1B:
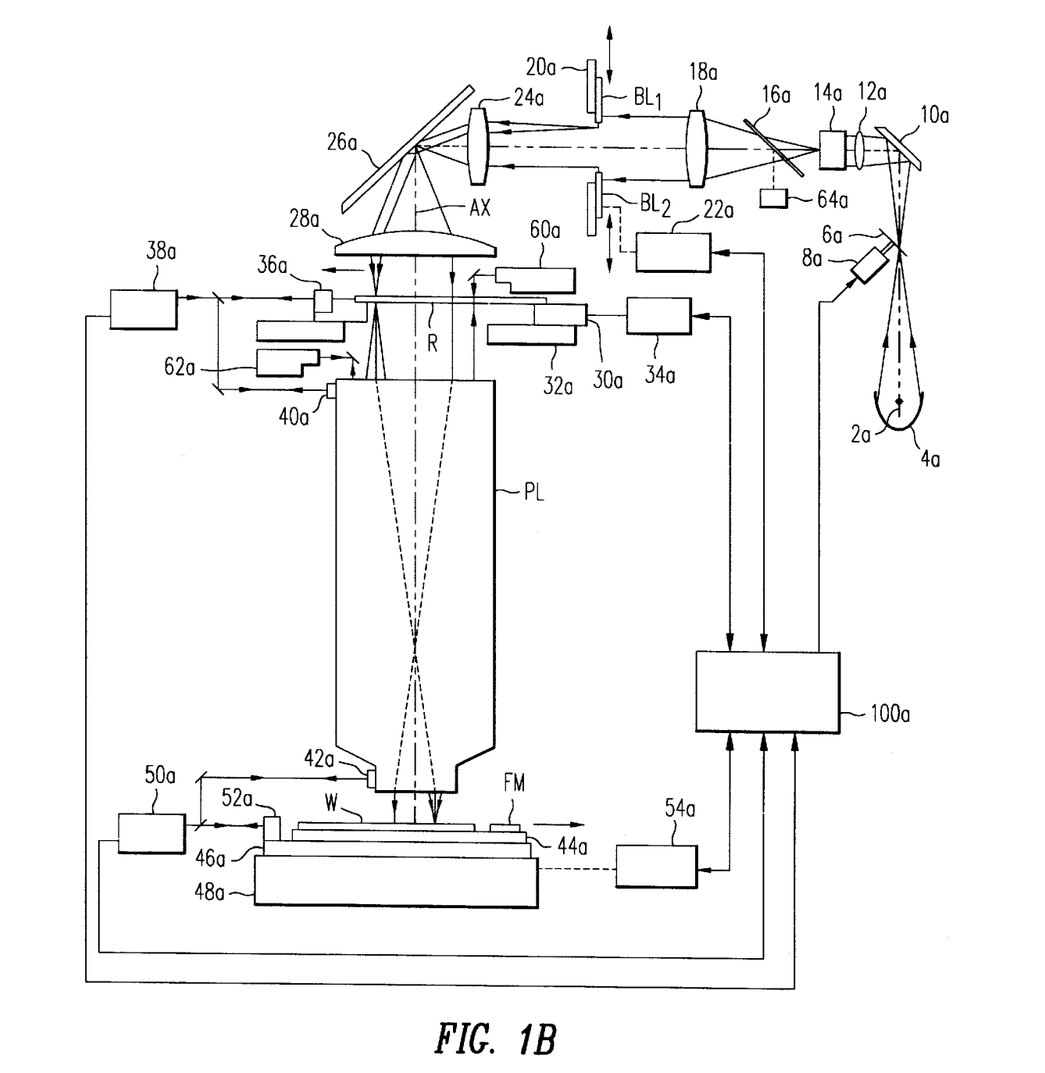
FIG. 1B is a side view of an entire lithographic apparatus which may use the FIG. 1A structure.

FIG. 1B is taken from Nishi U.S. Pat. No. 5,473,410 FIG. 3, issued Dec. 5, 1995, incorporated herein by reference in its entirety. This illustrates a projection exposure (lithographic) apparatus in which the FIG. 1A structure may be used as an x-y wafer stage or as the reticle stage (with suitable design adaptations apparent to one skilled in the art).

The follow description of present FIG. 1B follows that of FIG. 3 of U.S. Pat. No. 5,473,410, except that the reference numbers, instead of being identical to those of U.S. Pat. No. 5,473,410 FIG. 3, each have the letter "a" appended thereto for convenience of reference.

In FIG. 1B a projection lens PL is a projection optical system. Exposure illumination light emitted from a mercury lamp 2a is condensed at a second focal point through an elliptical mirror 4a. Disposed at the second focal point is a rotary shutter 6a. This operates with the aid of a motor 8a. The exposure illumination light passing through shutter 6a is reflected by a mirror 10a. The illumination light beam is incident on a fly eye lens system 14a via an input lens 12a. The illumination light falls on a lens system (condenser lens) 18a via a beam splitter 16a. Removable blades $BL_1$, $BL_2$, etc. at the blind mechanism 20a are individually independently moved by a driving system 22a. (This blind system is not required in such lithographic machines, however.) A reticle R is illuminated with the illumination light via a lens system 24a, a mirror 26a and a main condenser lens 28a.

The reticle R undergoes the illumination light defined by the aperture, defined by the blades and is held on the reticle stage 30a moving at least in the x direction on a column 32a. The reticle stage 30a is moved by driving system 34a. A movable mirror 36a reflects a length measuring beam emitted from a laser interferometer 38a is fixed to one end of the reticle stage 30a. A fixed mirror 40a for the laser interferometer 38a which is fixed to an upper edge of the lens barrel of the projection lens PL. Wafer W is held, with a fiducial mark FM, by a wafer holder 44a, capable of making microscopic rotation. The holder 44a is installed on a z stage 46a capable of effecting a micromotion in the z (vertical) direction.

The z stage 46a is installed on an x-y stage 48a moving two dimensionally in the x and y directions. Stage 48a is driven by a driving system 54a. Yawing and coordinates of x-y stage 48a are measured by a laser interferometer 50a. A fixed mirror 42a for laser interferometer 50a is fixed to a lower edge of the lens barrel of projection lens PL. A movable mirror 52a is fixed to one edge of the z stage 46a. There is an alignment system 60a, using through the reticle alignment, for detecting the alignment mark (or fiducial mark fm) on wafer W. There is also an alignment system 62a, using through the lens alignment, for detecting the alignment mark or fiducial mark FM on the wafer W through the projection lens.

Photoelectric sensor 64a receives light from a luminescent mark (when the fiducial mark FM is luminescent) via the projection lens PL, the reticle R, the condenser lens 28a, the lens systems 24a, 18a and the beam splitter 16a. This determines the position of the reticle R. Sequence and controlling this system is performed by main control unit 100a. This controls the structures shown connected thereto by the depicted lines terminating in arrows.

Figure 2:
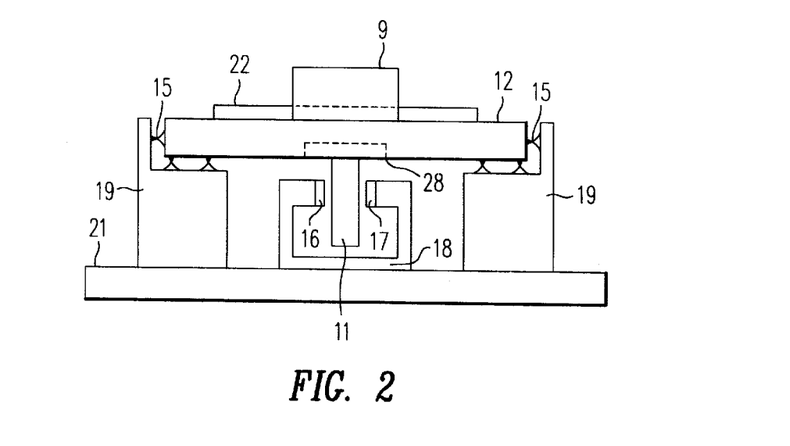
FIG. 2 is a schematic end view of the FIG. 1A structure.

FIG. 2 shows the side-face of the stage 12 of FIG. 1A. The stage 12 is supported by e.g. air bearings 15 on the linear guide 19, typically a smooth flat granite surface. Roller bearings or magnetic bearings may also be utilized. Coil magnets or permanent magnets 17 are mounted on inwardly-facing surfaces 16 of the yoke 18. The magnets 17 on one side of the coil assembly 11 and those on the other side of coil 11 are aligned so the magnets 17 produce a strong magnetic field between them. Magnets 17 and yoke 18 collectively are a magnet track. A housing block 28 contains a coolant inlet and outlet.

Figure 3:
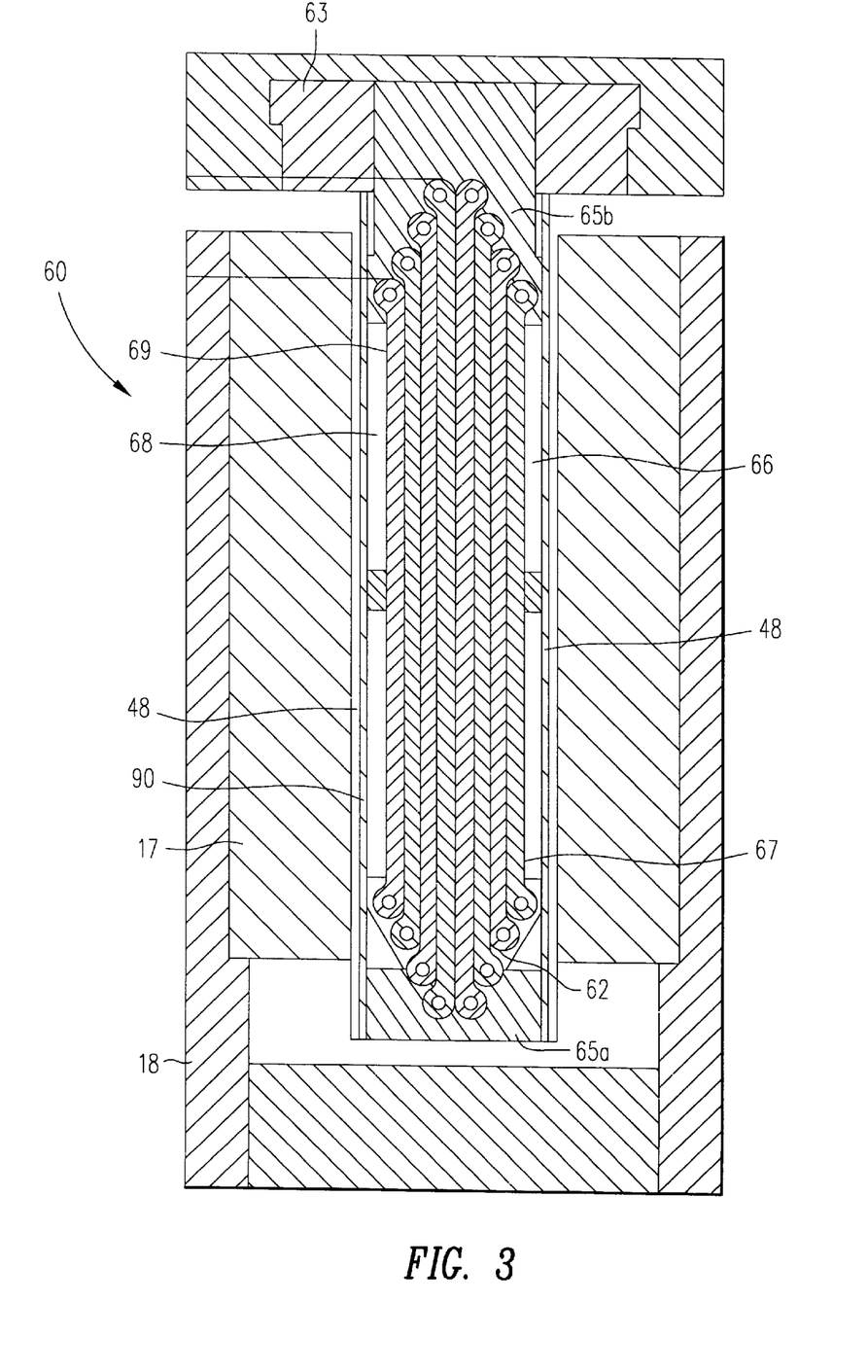
FIG. 3 is a cross-sectional view of the band coil embodiment of the linear motor.
Figure 4:
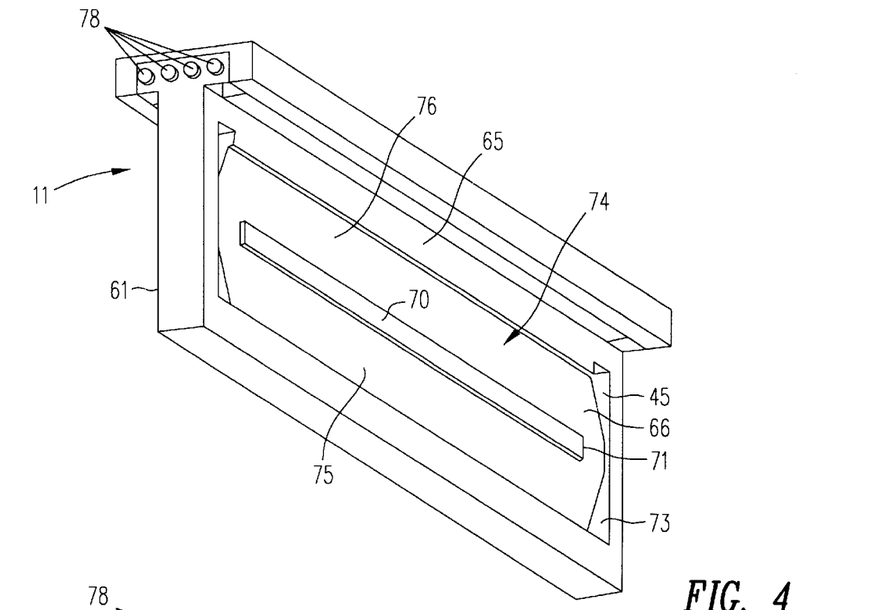
FIG. 4 is a perspective view of the encapsulated coil assembly thereof.
Figure 5:
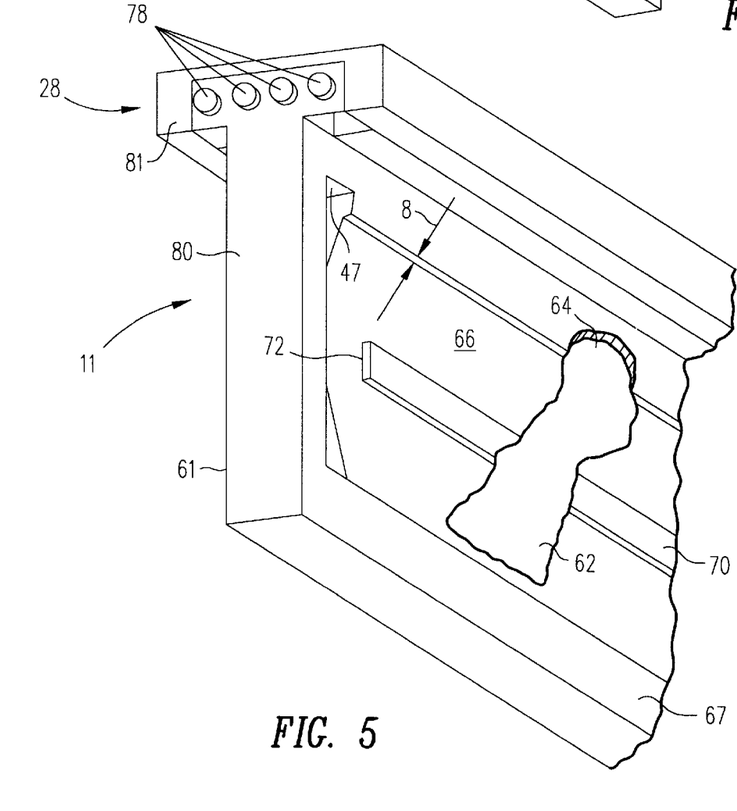
FIG. 5 is a perspective partial view of the coolant inlet and outlet and coolant bores of the coolant loop broken away to show the encapsulated coils.

Referring to FIGS. 3–5 which show the band coil embodiment, the linear motor 60 includes a yoke 18 which mounts a pair of spaced permanent magnets 17. A coil assembly 11 passes linearly through the magnets 17 with a gap 90 therebetween. Magnets 17 typically are neodymium iron boron (NdFeB) magnets. The overall armature 61 (FIG. 4) includes coils 62, such as band coils which are coils formed e.g. by insulated wire and which are supported by a cast structure 63. In one embodiment, eight coils are so supported, the coils being electrically connected in series. Typically, the cast support is a cast epoxy resin such as CB-1054A available from Dolph Co. of Monmouth Junction, N.J. Other casting resins may be employed. The casting resin may contain heat transmitting metal powders such as Alumina (assuming the coils are electrically insulated).

The resultant cast support 63 thus forms an elongated parallelogrammatic block 65. The block 65 is preferably such that a maximum amount of the coil's outer surface is not covered by the epoxy, but is in direct contact with the coolant. Cast in the block 65 are elongated recesses or slots 66 and 68 which extend along the outwardly facing opposite sides 67 and 69, respectively, of the coils 62. The recesses have a width and length substantially the same as the width and length of the banded coils 62. An integrally cast spacer 70 extends longitudinally of the recesses with the ends 71, 72 of the spacer terminating short of the ends 73 of the recesses, thus forming a divided pathway 74 having a first channel portion 75 connected to a parallel second channel portion 76. The spacer also functions as a central structural support since it is abutted and bonded to by a closure member 48. The spacer prevents "ballooning out" of the closure member which can affect the clearance provided by gap 90. Closure members 48 are in the form of rectangular thin sheets which with the assembly ends 65a and 65b form an outside enclosure (can) around the embedded coils. The thickness of the sheets may be from about 0.4 mm to about 2 mm.

The sheets may be metal, such as titanium or non-magnetic stainless steel, plastic such as nylon, or ceramic such as alumina. The sheets 48 are bonded to block 65 by an adhesive such as an epoxy adhesive (not shown) available from 3M Co. of Minneapolis, Minn., or otherwise connected to the block 65 so that the recesses are sealed at their peripheries. The interior surfaces of the closure members face the gap 90 between the overall armature 61 and the magnets 17. The block 65 has a T-configuration including a vertical portion 80 and a horizontal top cross-piece 81. A coolant inlet port (not shown) is provided in cross-piece 81 forming part of an inlet plenum 47 and a coolant outlet port (not shown) forming part of an outlet plenum 45 is provided in vertical portion 80 with a connecting outlet port in cross piece 81. Four electrical terminals 78 provide connections to the coils.

In one embodiment, the recesses have a depth 8 of from about 0.4 mm to about 2 mm. The coolant is e.g. Fluorinert coolant FC-77 available from the 3M Co. Typically a pumped coolant flow rate of about 3 liters/minute is employed with a 1° C. temperature rise being able to carry away about 90 watts of heat from the coils. A thermoelectric cooler in the coolant circulation system removes heat from the coolant.

Figure 6A:
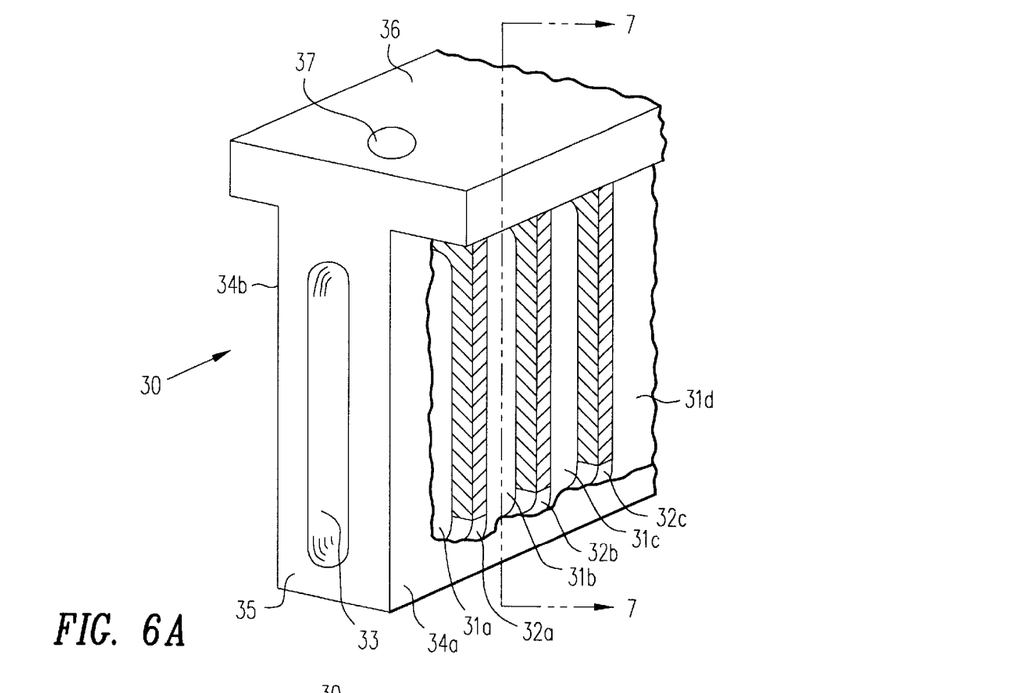
FIG. 6A is a schematic partially cutaway perspective view of the centerpole embodiment.
Figure 6B:
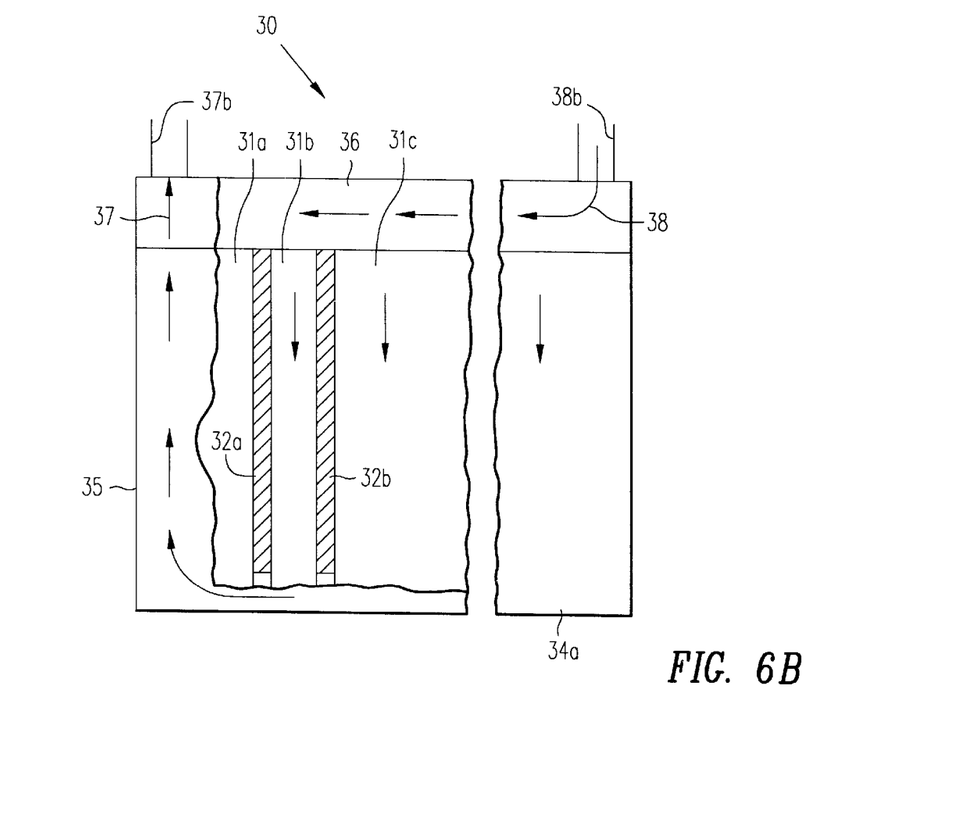
FIG. 6B is a side cutaway view of the same structure.
Figure 7:
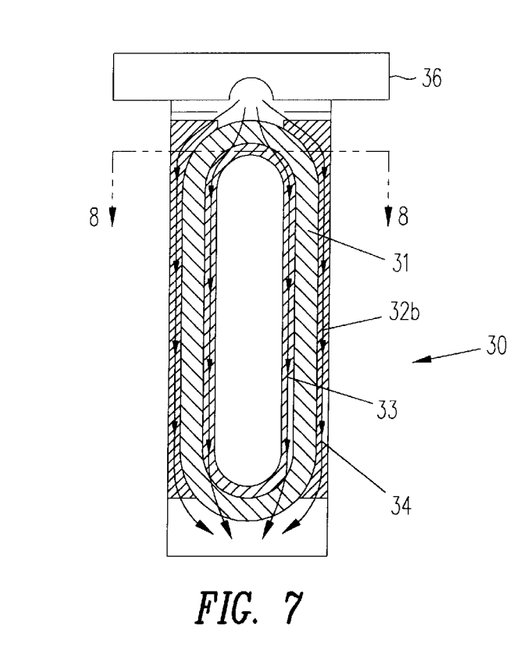
FIG. 7 is a cross-sectional side view thereof taken on the line 7—7 of FIG. 6A.
Figure 8:
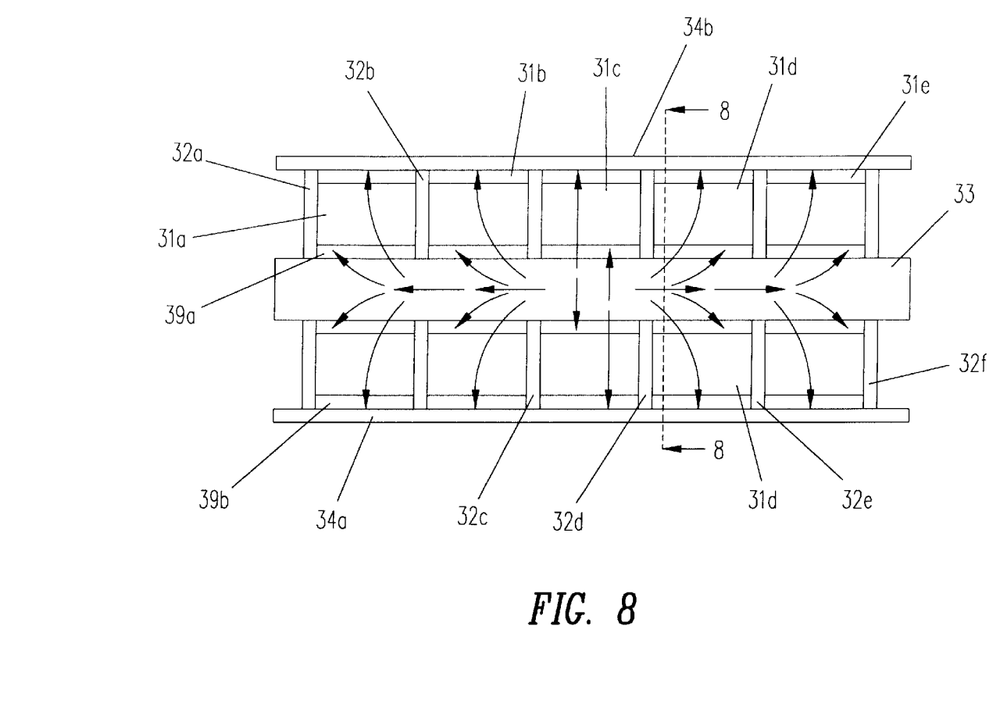
FIG. 8 is a cross-sectional view taken on the line 8—8 of FIG. 7.
Figure 9:
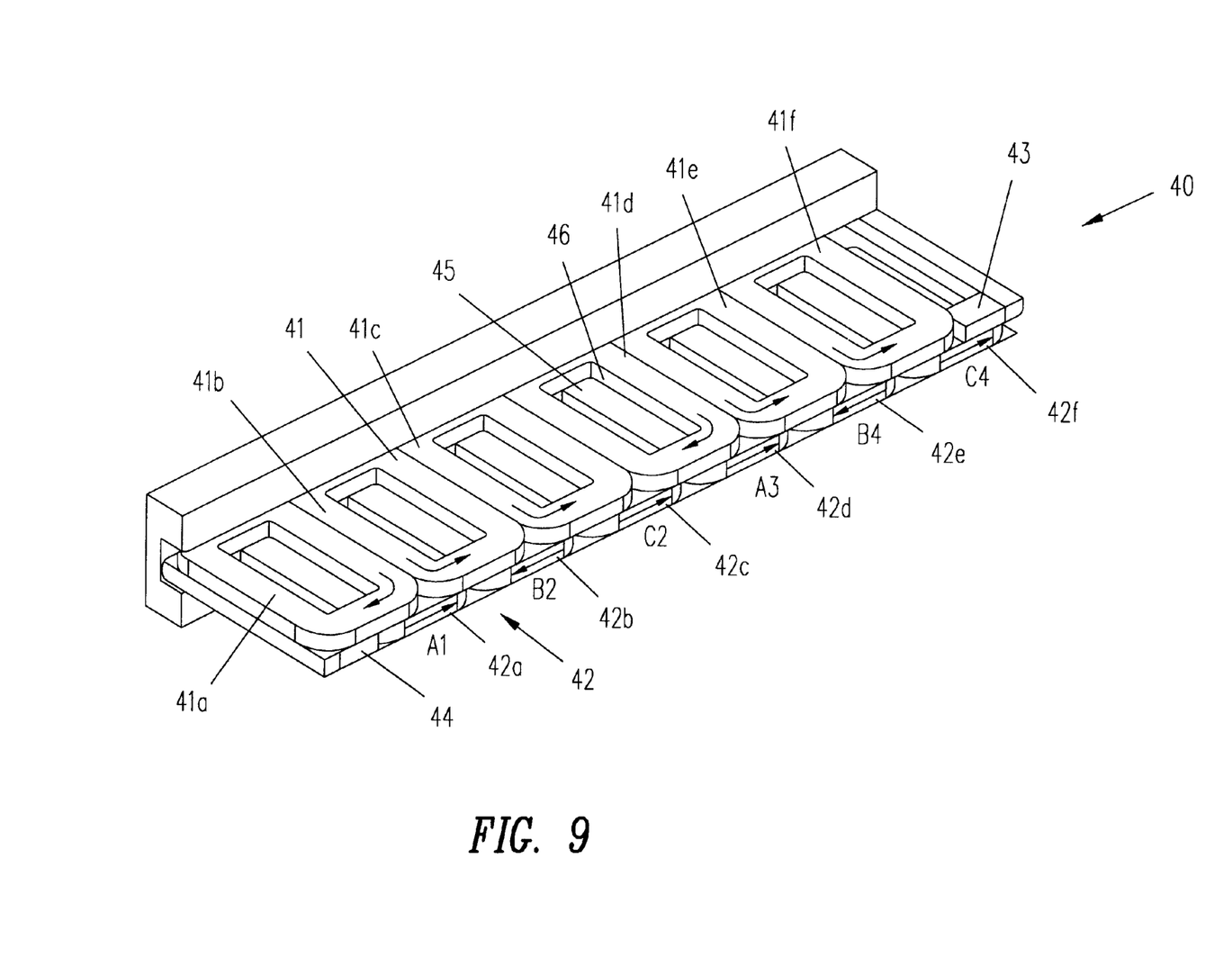
FIG. 9 is a schematic perspective view of the double layer of coils embodiment less an enclosure therearound.
Figure 10:
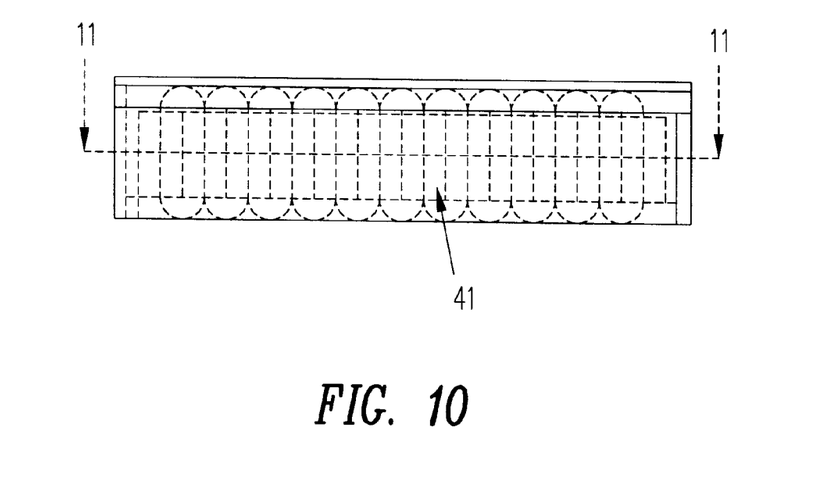
FIG. 10 is a top view thereof.
Figure 11:
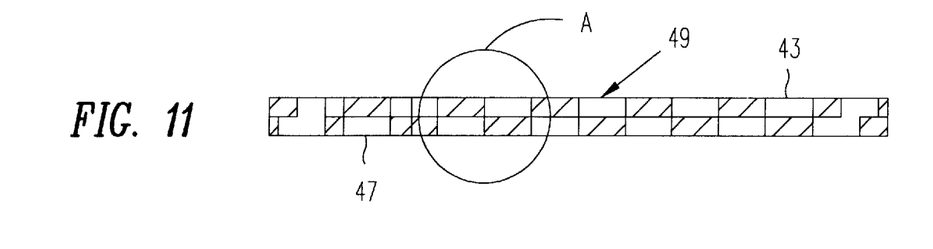
FIG. 11 is a longitudinal cross-sectional view of the coil assembly taken on the line 11—11 of FIG. 10.

FIGS. 6A–8 illustrate the centerpole motor cooling arrangement which includes a coil assembly 30 with a thin metal enclosure (can) 33 on the inside of the assembly and a second enclosure structure 34 on the outside thereof. The thin inside enclosure 33 is typically of non-magnetic stainless steel and has an oval configuration as seen in FIG. 7. FIG. 6A shows a cutaway perspective view; FIG. 6B shows a corresponding side view, but showing the full length of the structure FIG. 7 is a cross-sectional view along line 7—7 of FIG. 6A and FIG. 8 is a cross-sectional view along line 8—8 of FIG. 7. The outer enclosure 34 includes the side edges of block 35 and thin e.g. metal plates 34a, typically non-magnetic stainless steel sheets abutting and welded to the side edges of block 35 and extending laterally and vertically spaced from the exterior side walls of a series of coils 31 aligned side-by-side. Structures 33, 34, 35 are e.g. one piece or a welded assembly.

The individual coils 31a through 31e are separated by a series of insulating spacers 32a through 32f which have inner ends abutting the inner enclosure 33 and outer ends abutting the metal side plates 34. The spacers are constructed of a phenolic or other thermally insulating material and have dimensions so as to create a series of gaps 39a between the exterior of the inner enclosure 33 and the interior walls of the coils 31 and gaps 39b between the interior wall of outer enclosure structure 34 and the exterior walls of the coils 31. The arrows represent the flow of pumped coolant fluid from a plenum inlet 38 in a top-piece 36 to an outlet 37 of the assembly 30. Both elements 37, 38 are e.g. tapped holes into which respective screw-in pipe fittings 37b, 38b (FIG. 6B) fit. The coolant fluid flows outwardly and downwardly along the top of coils 31 through both the gaps 39a and 39b to draw off heat generated by the operation of the coils. Spacing between the coils and the cans is e.g. 1 to 2 mm. The coolant fluid with its acquired heat out flows through outlet 37. Thus the environment outside the outer enclosure structure is only exposed to the heat of the cooling fluid as transmitted through the outer enclosure structure. The much hotter coils 31 are at all locations insulated from the outside environment by the cooling fluid. The flow rate of the cooling fluid is chosen so that the cooling fluid carries away the coils-generated heat without an excessive, i.e. not more than about 1° C., temperature rise in the coolant fluid.

Figure 12:
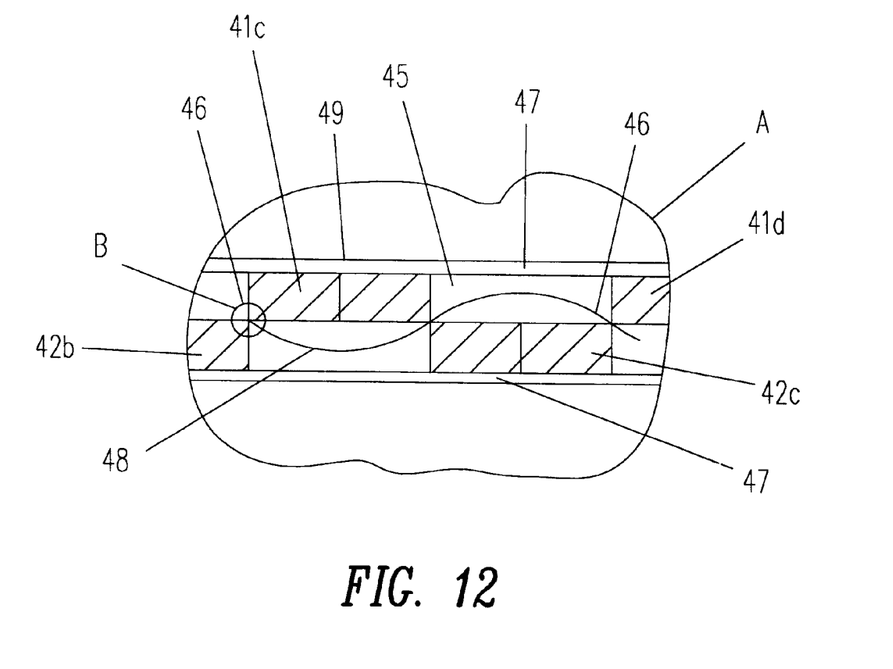
FIG. 12 is a magnified cross-sectional view of the circled portion A of FIG. 11.
Figure 13:
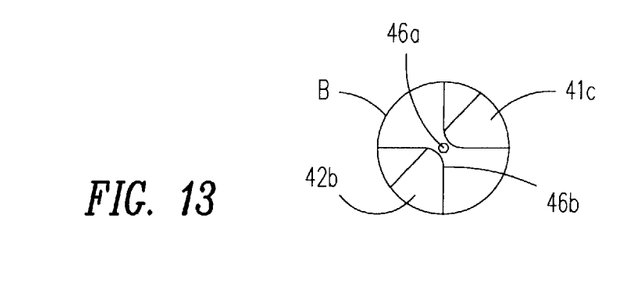
FIG. 13 is a magnified plan view of the gap in the circled portion B of FIG. 12.
Figure 14:
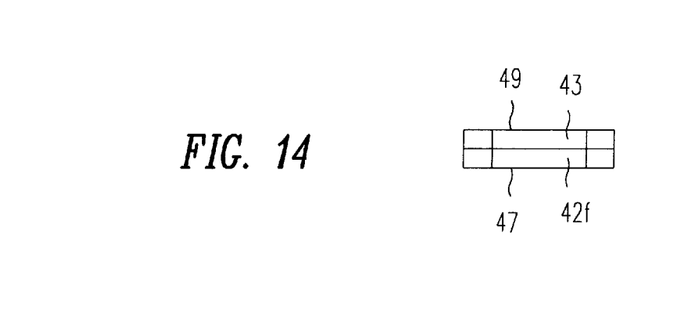
FIG. 14 is a schematic side view of the overall double layer embodiment including the exterior outer enclosure.

FIGS. 9–14 illustrate the double layer coil cooling arrangement which includes a coil assembly 40 having layers 41 and 42 of coils, 41a through 41f and 42a through 42f, respectively, the layer 42 being staggered with respect to layer 41. The respective coils are stacked such that internal cooling passages exist between the coils. Pockets (gaps) exist in the center of each coil so there is a serpentine coolant flow 48 under a coil 41 and over a coil 42 as seen in FIG. 12. The coils are configured to allow for a small gap, e.g. about 1 mm, between adjacent coils so that coolant fluid can flow from one pocket to the next pocket along the length of the coil assembly 40. The coil assembly is sandwiched between thin e.g. metal or plastic sheets 47 creating an outer enclosure 49. FIG. 13 illustrates chamfered edges 46a and 46b of the coils, which together form one of the gaps 46, namely between two of the stacked and staggered coils 42b and 41c. At each end of the assembly 40 are generally rectangular spacers 43 and 44 which also serve as an inlet plenum and an outlet plenum, respectively, by defining suitable passages.

Figure 15:
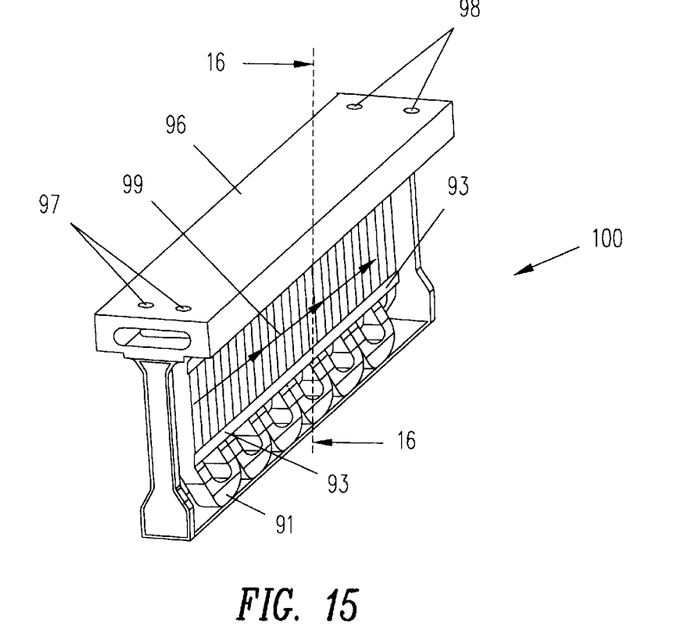
FIG. 15 is a schematic perspective of the dog-bone-shaped coil embodiment less the outer enclosure.
Figure 16:
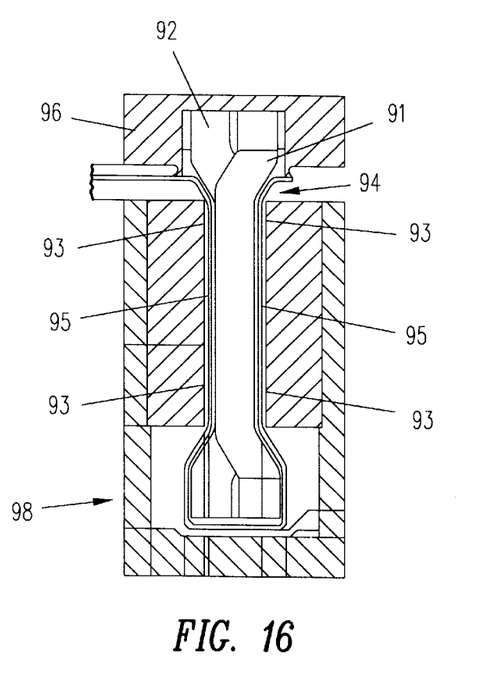
FIG. 16 is a cross-sectional view taken on the line 16—16 of FIG. 15 also showing in cross-section the outer enclosure and the motor magnet track.

FIGS. 15 and 16 illustrate the dog-bone shaped motor coil embodiment where a coil assembly 100 includes bent-ended coils 91 and 92, which when placed in an abutted side-by-side relationship, together form coils having, in one section of the coil, a profile approximating a dog-bone shape. Elongated longitudinal spacers 93 are adhesively affixed to transverse parallel portions of the exterior of both sides of the coil assembly. A conforming dog-bone shaped enclosure 94 surrounds the coil assembly with the spacers forming coolant channels 95 between the exterior surfaces of the coils 91, 92 and the inner surfaces of enclosure 94. The width of the channels 95 is determined by the thickness of the spacers 93.

The dog-bone enclosure is welded to the inner edges of a top-piece 96 having cooling fluid inlet 97 and an outlet 98 which permits coolant flow and a thickness of coolant liquid between the exterior of the coils and the interior of the enclosure 94. The environment outside the enclosure 94 is only exposed to the heat from the flowing coolant. FIG. 16 also shows the associated magnet track 98 (similar to that shown in FIG. 3) The arrows 99 in FIG. 15 show the flow of coolant across the exterior surfaces of one side of the coils 91, 92. Flow of coolant is also across the exterior surface of the coils on the opposite side of the assembly.

The above is intended to be illustrative and not limiting. Other embodiments and modifications will be obvious to those skilled in the art in view of the above disclosure and are intended to fall within the scope of the appended claims.

We claim:

1. Apparatus comprising:
   a motor coil having at least one side wall;
   at least one enclosure member conforming to said at least one side wall;
   coolant passages defined between said side wall and said at least one enclosure member;
   an inlet flow connection to said coolant passages, thereby to flow coolant fluid through said coolant passages to cool said side wall; and
   an outlet flow connection to said coolant passages, thereby to remove said coolant fluid heated by operation of said motor coil;
   wherein the motor coil having two sidewalls and wherein said motor coil includes a series of linearly aligned coils, each adjacent pair of coils forming a dogbone shape;
   wherein said at least one enclosure member comprises a dogbone-shaped enclosure spaced from the side wall.

2. The apparatus of claim 1 wherein said motor coil comprises an array of stacked coils, to define a series of gaps between adjacent stacked coils;
   wherein said series of gaps additionally defines the coolant passage; and
   wherein said at least one enclosure member surrounds said array of stacked coils, said at least one enclosure forming with said series of gaps, a passageway for moving a sinusoidal flow of the coolant fluid past at least one portion of each of the coil side walls, wherein the motor coil having two sidewalls and wherein said motor coil includes a series of linearly aligned coils, each adjacent pair of coils forming a dogbone shape;

wherein said at least one enclosure member comprises a dogbone-shaped enclosure spaced from the side wall.

3. The apparatus of claim 2 wherein said at least one enclosure member comprises a first sheet extending across said coils and a second sheet extending across said coils, such that the staggered rows of coils are sandwiched between said sheets.

4. The apparatus of claim 1, further including a pair of longitudinal spacers between said side walls and an interior surface of said dog-bone shaped enclosure forming said coolant passages.

5. The apparatus of claim 4 wherein said spacers are in parallel along and in contact with the transverse longitudinal length of said series of coils and in contact with the interior surface of said dog-boned shaped enclosure.

6. The apparatus of claim 4 wherein said inlet communicates with an inlet plenum positioned at a first end of said series of coils and wherein said outlet communicates with an outlet plenum at a second end of said series of coils opposite the first end.

7. The apparatus of claim 1, wherein said at least one enclosure member extends generally co-extensively with a width and a length of said side wall and is juxtaposed to said sidewall.

8. The apparatus of claim 1, wherein said motor coil has a second sidewall opposing said at least one sidewall, and comprising a second enclosure member conforming to said second sidewall.

9. The apparatus of claim 1, further including a spacer between said at least one sidewall and an interior surface of said enclosure member and defining said coolant passages.

10. The apparatus of claim 9, wherein said spacer is in contact with an interior surface of said enclosure member.

11. The apparatus of claim 1, further including a stage driven by said linear motor, wherein said motor coil moves along a magnetic track and said stage is coupled to one of said motor coil or said magnetic track.

12. An apparatus comprising:
a motor coil having at least one side wall;
at least one enclosure member conforming to said at least one side wall;
coolant passages defined between said side wall and said at least one enclosure member;
an inlet flow connection to said coolant passages, thereby to flow coolant fluid through said coolant passages to cool said side wall;
an outlet flow connection to said coolant passages, thereby to remove said coolant fluid heated by operation of said motor coil;
wherein said motor coil comprises an array of stacked coils, to define a series of gaps between adjacent stacked coils;
wherein said series of gaps additionally defines the coolant passage; and
wherein said at least one enclosure member surrounds said array of stacked coils, said at least one enclosure forming with said series of gaps, a passageway for moving a sinusoidal flow of the coolant fluid past at least one portion of each of the coil sidewalls;
wherein said inlet is in communication with an inlet plenum and further including a spacer extending between said inlet plenum and an end of one of a row of said coils thereby additionally defining said coolant passages.

13. An apparatus comprising:
a motor coil having at least one side wall;
at least one enclosure member conforming to said at least one side wall;
coolant passages defined between said side wall and said at least one enclosure member;
an inlet flow connection to said coolant passages, thereby to flow coolant fluid through said coolant passages to cool said side wall;
an outlet flow connection to said coolant passages, thereby to remove said coolant fluid heated by operation of said motor coil; and
further including a series of coils and an integral longitudinal spacer extending transversely across each side of the series of coils thereby additionally defining said coolant passage.

14. A lithographic apparatus comprising:
a source of a beam;
a lens into which said beam is directed, for focusing said beam onto a substrate;
a stage holding one of said substrate or a reticle, said beam passing through said reticle onto said substrate;
a linear motor which drives said stage in a direction perpendicular to an axis, of said beam, said linear motor including a motor coil and a cooperating magnetic track, one of said motor coil or magnetic track being mounted to said stage; and
a cooling apparatus for cooling said motor coil, said motor coil having at least one side wall, said cooling apparatus comprising:
at least one enclosure member conforming to said at least one side wall;
coolant passages defined between said side wall and said at least one enclosure member;
an inlet flow connection to said coolant passages, thereby to flow coolant fluid through said coolant passages to cool said side wall; and
an outlet flow connection to said coolant passages, thereby to remove said coolant fluid heated by operation of said motor coil;
the motor coil having two sidewalls and wherein said motor coil includes a series of linearly aligned coils, each adjacent pair of coils forming a dogbone shape;
wherein said at least one enclosure member comprises a dogbone-shaped enclosure spaced from the side wall.

15. An apparatus comprising:
a motor coil having at least one exterior side wall;
at least one enclosure member conforming to said at least one exterior side wall;
coolant passages defined between said exterior side wall and said at least one enclosure member;
an inlet flow connection to said coolant passages, thereby to flow coolant fluid through said coolant passages to cool said side wall; and
an outlet flow connection to said coolant passages, thereby to remove said coolant fluid heated by operation of said motor coil;
said coil defining a central cavity, and an interior side wall of said coil being enclosed by a conforming second enclosure member confining said coolant within said second enclosure member and away from said central cavity.

16. A lithographic apparatus comprising:

an illumination system that irradiates radiant energy;

a stage device that carries an object disposed on a path of said radiant energy; and a linear motor that drives said stage, aid linear motor including a motor coil and a cooperating magnetic track and cooling apparatus for cooling said motor coil, said motor coil having at least one side wall, said cooling apparatus comprising:

at least one enclosure member conforming to said at least one side wall; and coolant passages defined between said side wall and said at least one enclosure member;

the motor coil having two side walls and wherein said motor coil includes a series of linearly aligned coils, each adjacent pair of coils forming a dogbone shape; and wherein said at least one enclosure member comprises a dogbone-shaped enclosure spaced apart from the side wall.

17. A wafer on which an image has been formed by the lithographic apparatus of claim 16.

* * * * *